(12) United States Patent
Uemura et al.

(10) Patent No.: US 9,209,306 B2
(45) Date of Patent: Dec. 8, 2015

(54) THIN FILM TRANSISTOR AND DISPLAY DEVICE USING THE SAME

(71) Applicant: Japan Display Inc., Tokyo (JP)

(72) Inventors: Norihiro Uemura, Mobara (JP); Takeshi Noda, Mobara (JP); Hidekazu Miyake, Mobara (JP); Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 203 days.

(21) Appl. No.: 13/851,162

(22) Filed: Mar. 27, 2013

(65) Prior Publication Data

US 2013/0278855 A1    Oct. 24, 2013

(30) Foreign Application Priority Data

Apr. 24, 2012    (JP) .................................. 2012-098764

(51) Int. Cl.
| G02F 1/136 | (2006.01) |
| H01L 29/786 | (2006.01) |
| G02F 1/1368 | (2006.01) |

(52) U.S. Cl.
CPC ........ *H01L 29/78606* (2013.01); *G02F 1/1368* (2013.01); *H01L 29/7869* (2013.01)

(58) Field of Classification Search
CPC ....................... H01L 29/7869; H01L 29/78606
USPC ........ 349/42, 43, 46, 47; 257/43, 59, 324, 57; 438/104, 795
See application file for complete search history.

(56) References Cited

U.S. PATENT DOCUMENTS

| 6,127,285 | A | * | 10/2000 | Nag ............................... 438/788 |
| 8,670,080 | B2 | | 3/2014 | Sato |
| 8,779,418 | B2 | * | 7/2014 | Miyanaga et al. ............... 257/43 |
| 2006/0003598 | A1 | * | 1/2006 | Li et al. .......................... 438/778 |
| 2007/0072439 | A1 | * | 3/2007 | Akimoto et al. ............... 438/795 |
| 2008/0142800 | A1 | * | 6/2008 | Arai et al. ........................ 257/59 |
| 2009/0224293 | A1 | * | 9/2009 | Miyanami ..................... 257/288 |
| 2010/0038646 | A1 | * | 2/2010 | Arai et al. ........................ 257/59 |
| 2010/0065844 | A1 | | 3/2010 | Kazuhiko |
| 2010/0133525 | A1 | * | 6/2010 | Arai et al. ....................... 257/40 |

(Continued)

FOREIGN PATENT DOCUMENTS

| JP | H04-174563 A | 6/1992 |
| JP | 2004-091243 A | 3/2004 |

(Continued)

OTHER PUBLICATIONS

Office Action dated Aug. 4, 2015 regarding a counterpart Japanese patent application No. 2012-098764, citing the above reference(s).

*Primary Examiner* — Sang V Nguyen
(74) *Attorney, Agent, or Firm* — Lowe Hauptman & Ham, LLP

(57) ABSTRACT

A thin film transistor includes, an insulating substrate, a gate electrode provided on an upper surface of the insulating substrate, a gate insulating film formed so as to cover the gate electrode, an oxide semiconductor layer provided on the gate insulating film, a channel protective layer provided at least on an upper surface of the oxide semiconductor layer, and a source electrode and a drain electrode provided so as to come into contact with the oxide semiconductor layer, wherein the channel protective layer is formed such that the film density of a portion provided so as to come into contact with the oxide semiconductor layer is higher than the film density of a portion distant from the oxide semiconductor layer.

7 Claims, 9 Drawing Sheets

(56) References Cited

U.S. PATENT DOCUMENTS

| | | | |
|---|---|---|---|
| 2011/0042670 A1* | 2/2011 | Sato et al. | 257/43 |
| 2011/0180802 A1* | 7/2011 | Morosawa et al. | 257/59 |
| 2011/0215328 A1 | 9/2011 | Narihiro et al. | |
| 2011/0240998 A1* | 10/2011 | Morosawa et al. | 257/57 |
| 2012/0112182 A1* | 5/2012 | Ishii et al. | 257/43 |
| 2012/0223301 A1* | 9/2012 | Ueda et al. | 257/43 |

FOREIGN PATENT DOCUMENTS

| | | |
|---|---|---|
| JP | 2009-272427 | 11/2009 |
| JP | 2010-073894 A | 4/2010 |
| JP | 2010-135462 | 6/2010 |
| JP | 2011-187506 A | 9/2011 |
| JP | 2012-073442 A | 4/2012 |

\* cited by examiner

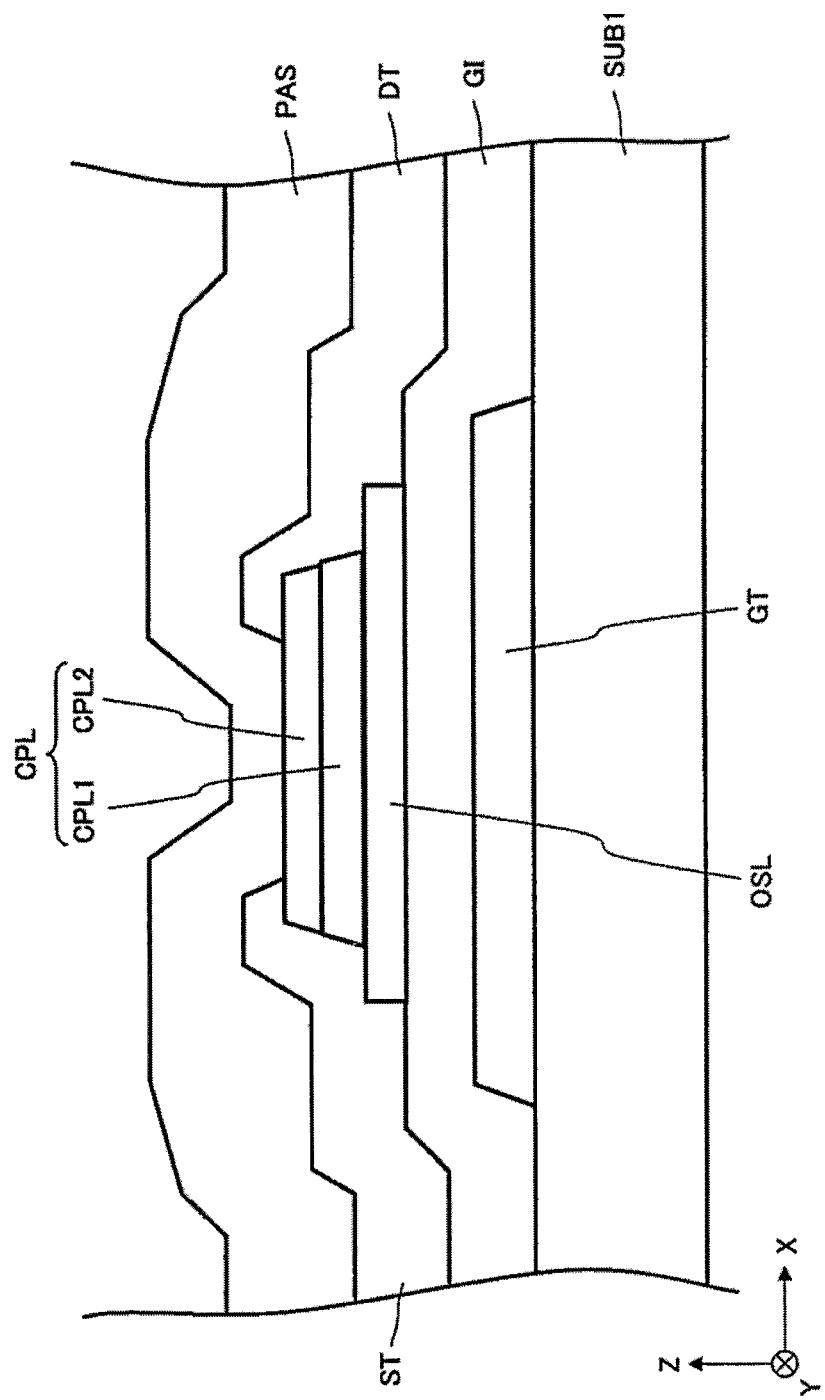

FIG.5

| No. | FILM DENSITY OF FIRST CHANNEL PROTECTIVE LAYER (g/cm³) | FILM DENSITY OF SECOND CHANNEL PROTECTIVE LAYER (g/cm³) | FILM DENSITY DIFFERENCE (g/cm³) | EVALUATION RESULT OF FILM PEELING |
|---|---|---|---|---|
| 1 | 2.21 | 1.89 | 0.32 | − |
| 2 | 2.43 | 2.21 | 0.22 | FILM PEELING |
| 3 | 2.43 | 2.32 | 0.11 | FILM PEELING |
| 4 | 2.56 | 2.21 | 0.35 | − |
| 5 | 2.56 | 2.30 | 0.26 | FILM PEELING |
| 6 | 2.60 | 2.56 | 0.04 | FILM PEELING |
| 7 | 2.60 | 2.30 | 0.30 | − |
| 8 | 2.60 | 2.21 | 0.39 | − |

THIN FILM TRANSISTOR AND DISPLAY DEVICE USING THE SAME

CROSS-REFERENCE TO RELATED APPLICATION

The present application claims priority from Japanese patent application JP 2012-098764 filed on Apr. 24, 2012, the content of which is hereby incorporated by reference into this application.

BACKGROUND OF THE INVENTION

1. Field of the Invention

The present invention relates to a thin film transistor and a display device, and particularly to an oxide semiconductor thin film transistor which uses an oxide semiconductor for a semiconductor layer and a display device using the same.

2. Description of the Related Art

There is an oxide semiconductor thin film transistor (also referred to as an oxide thin film transistor or an oxide semiconductor TFT) as a favorable thin film transistor in which the mobility is high and a variation in a threshold voltage Vth is small in an approximately equivalent process as compared with an amorphous silicon thin film transistor (Si-TFT). When the oxide semiconductor TFT is implemented, a high density silicon oxide film is used for a channel protective layer (stopper layer), and thereby it is possible to implement a thin film transistor with good reliability, high mobility, and high On/Off ratio. However, if this high density silicon oxide film is to be formed thickly, a film stress increases and thus a problem such as film peeling occurs, and thereby reliability of a thin film transistor is reduced.

As a method of solving the reduction in the reliability, there is a thin film transistor disclosed in JP 2010-135462 A or JP 2009-272427 A. In the thin film transistor disclosed in JP 2010-135462 A, a first channel protective layer and a second channel protective layer are formed on an oxide semiconductor layer, and either one of the channel protective layers is made of a material with low oxygen permeability. In this case, the first channel protective layer is made of silicon oxide, tantalum oxide, titanium oxide, hafnium oxide, zirconium oxide, yttrium oxide, aluminum oxide, or a nitrogen-containing compound thereof, or silicon nitride.

In addition, in the thin film transistor disclosed in JP 2009-272427 A, a channel protective layer is formed of two layers including a first channel protective layer and a second channel protective layer, and the second channel protective layer is laminated on the first channel protective layer. In this case, the channel protective layer is formed of an oxide such as a silicon oxide film, a silicon oxynitride film, an aluminum oxide film, an yttrium oxide film, or a magnesium oxide film.

SUMMARY OF THE INVENTION

JP 2010-135462 A and JP 2009-272427 A disclose a technique for improving reliability by providing the channel protective layers formed of two layers. In addition, preferable materials for forming the channel protective layers are also disclosed.

However, as disclosed in JP 2010-135462 A and JP 2009-272427 A, if the first channel protective layer and the second channel protective layer are intended to be made of different materials, there is a problem in that the manufacturing time and costs increase as compared with a case where the channel protective layers are made of the same material. This is because, for example, in a case where two channel protective layers are formed using a sputtering method, the channel protective layers are separately formed in chambers in which each sputtering target is installed. In addition, in a case where channel protective layers are formed using a Chemical Vapor Deposition (CVD) method, it is necessary to form the layers such that the channel protective layer is formed in a different chamber in order to prevent impurities from being mixed, or, after a first layer is formed, a chamber is cleaned with a nitrogen trifluoride gas or the like, and then a second layer is formed.

On the other hand, the present inventor or the like has found that, even in a case where the channel protective layers are made of the same material, film densities of the channel protective layers are greatly different depending on a film forming method or a film forming condition, and thereby a passivation performance (protective performance) becomes greatly different. In a case where a high density silicon oxide film is intended to be formed thickly in order to increase the passivation performance, there is a problem in that the film stress increases and thus film peeling occurs.

The present invention has been made in consideration of this problem, and an object of the present invention is to provide an oxide semiconductor thin film transistor capable of preventing a film from peeling when channel protective layers are formed.

(1) A thin film transistor according to an aspect of the present invention includes an insulating substrate; a gate electrode provided on an upper surface of the insulating substrate; a gate insulating film formed so as to cover the gate electrode; an oxide semiconductor layer provided on the gate insulating film; a channel protective layer provided at least on an upper surface of the oxide semiconductor layer; and a source electrode and a drain electrode provided so as to come into contact with the oxide semiconductor layer, wherein the channel protective layer is formed such that the film density of a portion provided so as to come into contact with the oxide semiconductor layer is higher than the film density of a portion distant from the oxide semiconductor layer.

(2) A display device according to another aspect of the present invention includes a first substrate formed of an insulating substrate, wherein the first substrate includes video signal lines extending in a Y direction and disposed in parallel in an X direction; scanning signal lines extending in the X direction and disposed in parallel in the Y direction; pixel electrodes supplied with video signals from the video signal lines via thin film transistors; and a common electrode supplied with a common signal which are used as a reference of the video signals, wherein pixel regions surrounded by the video signal lines and the scanning signal lines are formed in a matrix, and wherein each of the thin film transistors is formed of the thin film transistor set forth in (1).

According to the present invention, it is possible to prevent film peeling of channel protective layers in an oxide semiconductor thin film transistor.

Other effects of the present invention will become apparent from the overall disclosure of the specification.

BRIEF DESCRIPTION OF THE DRAWINGS

FIG. 1 is a cross-sectional view illustrating a schematic configuration of a thin film transistor according to Embodiment 1 of the present invention.

FIG. 5 is a table illustrating a result of evaluating whether or not film peeling occurs in a sample which is created by varying a film density of the first channel protective layer and a film density of the second channel protective layer in the thin film transistor according to Embodiment 1 of the present invention.

DETAILED DESCRIPTION OF THE INVENTION

Figure 2A:
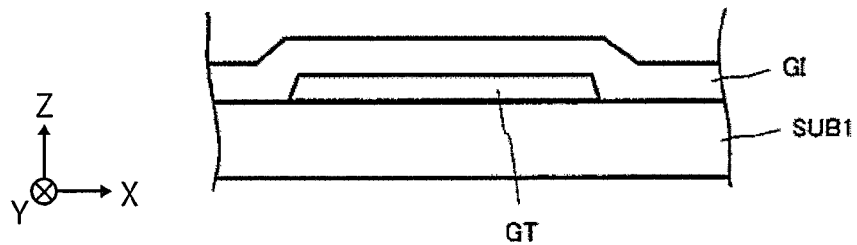
FIG. 2A is a diagram illustrating a manufacturing method of the thin film transistor according to Embodiment 1 of the present invention.

Hereinafter, embodiments of the present invention will be described with reference to the drawings. However, in the following description, the same constituent element is given the same reference numeral, and repeated description will be omitted. In addition, X, Y, and Z shown in the drawings respectively indicate an X axis, a Y axis, and a Z axis.

Embodiment 1

FIG. 1 is a cross-sectional view illustrating a schematic configuration of a thin film transistor according to Embodiment 1 of the present invention, and, hereinafter, an overall configuration of the thin film transistor according to Embodiment 1 will be described with reference to FIG. 1. Here, the thin film transistor according to Embodiment 1 has a so-called bottom gate type transistor structure.

As is clear from FIG. 1, in the thin film transistor according to Embodiment 1, a gate electrode GT is formed on a surface (upper surface) of a first substrate SUB1 formed of an insulating substrate such as a glass substrate. The gate electrode GT is formed using a conductive film material including a metal thin film such as, for example, aluminum. In addition, a gate insulating film GI is formed on an upper surface of the gate electrode GT so as to also cover the surface of the first substrate SUB1. The gate insulating film GI is formed of, for example, a well-known insulating film such as a silicon oxide film, a silicon nitride film, or a silicon oxynitride film. In addition, the gate insulating film GI may have a structure in which two or more thin films are laminated, or a structure formed by any combination of the above-described insulating films, but a layer which comes into contact with an oxide semiconductor layer OSL uses a silicon oxide film. In addition, the gate insulating film GI is formed in a range in which the film thickness thereof is 80 nm or more and 2000 nm or less, and may be formed with an appropriate and optimal film thickness in consideration of a withstand voltage of insulation or capacitance.

The oxide semiconductor layer OSL is formed on an upper layer of the gate insulating film GI so as to overlap the gate electrode GT in plan view. A first channel protective layer CPL1 is formed on an upper surface of the oxide semiconductor layer OSL so as to come into contact with the oxide semiconductor layer OSL in an overlapping manner, and a second channel protective layer CPL2 is formed on an upper surface of the first channel protective layer CPL1 so as to come into contact with the first channel protective layer CPL1 in an overlapping manner, thereby forming channel protective layers CPL of Embodiment 1. In this case, the first channel protective layer CPL1 and the second channel protective layer CPL2 are formed so as to have a smaller width in the X direction than the oxide semiconductor layer OSL, and an upper surface of the opposite end of the oxide semiconductor layer OSL is formed so as to be exposed from the first channel protective layer CPL1 and the second channel protective layer CPL2.

In this case, the oxide semiconductor layer OSL of Embodiment 1 is an oxide semiconductor based on well-known In—Ga—Zn—O including indium (In), gallium (Ga), zinc (Zn), and oxygen (O) as main component elements, which is hereinafter abbreviated to an IGZO film in some cases. The oxide semiconductor may employ In—Al—Zn—O, In—Sn—Zn—O, In—Zn—O, In—Sn—O, Zn—O, Sn—O, and the like, using Aluminum (Al) or tin (Sn) in addition to the In—Ga—Zn—O oxide semiconductor. In addition, the film thickness of the oxide semiconductor layer OSL ranges from 30 nm or more to 500 nm, and the film thickness may be adjusted depending on the purpose, for example, in a case where the TFT is used in a device requiring large current, the film thickness may be large.

The first and second channel protective layers CPL1 and CPL2 are formed of a silicon oxide film. Particularly, the film density of the silicon oxide film applied to the first channel protective layer CPL1 is high, and, thus, as described later in detail, the film density thereof is preferably 2.2 g/cm$^3$ or more and 2.6 g/cm$^3$ or less. With this configuration, it is possible to implement a thin film transistor TFT with high reliability. In addition, it is desirable that the film thickness of the first channel protective layer CPL1 is about 200 nm or less. For example, as described later in detail, in a sample created by the present inventor, film peeling occurred in a case where the film thickness of the first channel protective layer CPL1 was 300 nm and 400 nm. This is considered to be because the first channel protective layer CPL1 is a high density film, and, in a case where the high density film is formed thickly, the film stress increases. Therefore, the film thickness of the first channel protective layer CPL1 is preferably about 200 nm or less.

On the other hand, the film density of the silicon oxide film applied to the second channel protective layer CPL2 is lower than the film density of the silicon oxide film applied to the first channel protective layer CPL1. For example, as described later in detail, when the first channel protective layer CPL1 is formed of a silicon oxide film with the film density of 2.5 g/cm$^3$, the second channel protective layer CPL2 is preferably formed of a silicon oxide film with the film density of 2.2 g/cm$^3$. In addition, the second channel protective layer CPL2 is formed on the first channel protective layer CPL1 so as to supplement passivation (protective function) of the first channel protective layer CPL1, and is formed under a condition in which the film stress of the first channel protective layer CPL1 is alleviated so as not to generate film peeling. In order to satisfy this condition, the film thickness of the second channel protective layer CPL2 is preferably 200 nm or more, and the total film thickness with the first channel protective layer CPL1 is preferably 600 nm or less. This is because, if the film thickness of the second channel protective layer CPL2 is 200 nm or less, the film thickness is small and thus a passivation performance is insufficient. On the other hand, this is because, in a case where the second channel protective layer CPL2 is formed thickly and the total film thickness with the first channel protective layer CPL1 is 600 nm or more, the coverage of a source/drain electrode wire on the side walls of the channel protective layers CPL becomes insufficient, and thereby problems occurs such as disconnection of the wire or occurrence of a gap.

Of the end surfaces of the oxide semiconductor layer OSL exposed from the first channel protective layer CPL1 and the second channel protective layer CPL2, a conductive film (formed of a transparent conductive film or a metal thin film) which will become a source electrode ST extending from the upper surface of the first channel protective layer CPL1 is laminated on one exposed surface and is formed extending on the upper surface of the gate insulating film GI. On the other hand, a conductive film which will become a drain line DL extending from the upper surface of the first channel protective layer CPL1 is laminated on the other exposed surface and is formed extending on the upper surface of the gate insulating film GI. With this configuration, the source electrode ST and a drain electrode DT are disposed so as to be opposite to each other in the X direction via the first channel protective layer CPL1, the second channel protective layer CPL2, and the oxide semiconductor layer OSL. In other words, a bottom gate type oxide semiconductor thin film transistor is formed. The source electrode ST, the drain electrode DT, and the gate electrode GT are made of, for example, elements selected from aluminum, molybdenum, chromium, copper, tungsten, titanium, zirconium, tantalum, silver, and manganese, or an alloy or the like which is a combination of these elements. In addition, a laminate structure may be employed in which aluminum is laminated on titanium, or titanium is interposed between an upper layer and a lower layer of aluminum. Further, a well-known transparent conductive film such as ITO or ZnS may be used.

A passivation layer (protective layer) PAS which is formed of an inorganic insulating film or an organic insulating film is formed on the upper surface side of the first substrate SUB1 including the source electrode ST, the drain electrode DT, and the second channel protective layer CPL2, so as to cover and protect each of them. This passivation layer PAS is formed of an insulating film such as, for example, a well-known silicon oxide film, silicon nitride film, or silicon oxynitride film. In addition, the protective layer (passivation layer) PAS is not limited to a single-layer insulating film structure, and may have a structure in which two or more insulating films are laminated or a structure in which any of the above-described insulating films are combined.

[Manufacturing Method]

Next, FIGS. 2A to 2D and 3E to 3G are diagrams illustrating a manufacturing method of the thin film transistor according to Embodiment 1 of the present invention, and, hereinafter, the manufacturing method will be described in detail with reference to FIGS. 2A to 2D and 3E to 3G. Particularly, in the manufacturing processes described below, processes of forming the gate electrode, the gate insulating film, the semiconductor layer, the channel protective layers, the source and drain electrodes, and the passivation layer will be described in detail. In addition, in the following description, for simplicity of the description, a thin film layer before being patterned is given the same reference sign as after being patterned.

a) Formation of Gate Electrode and Gate Insulating Film (Refer to FIG. 2A)

First, a metal conductive film such as a molybdenum film or an aluminum film is formed on the surface of the first substrate SUB1 such as a glass substrate using a sputtering method. Successively, a photosensitive resin (photosensitive resist) which is a well-known resist material is applied on the metal conductive film so as to form a photosensitive resin film, then the photosensitive resin film is developed and patterned, thereby forming a resist pattern corresponding to a shape of the gate electrode GT. Thereafter, the metal conductive film exposed from the resist pattern is removed using wet etching or the like, and then the resist pattern is peeled off so as to form the gate electrode GT. In addition, the gate electrode GT is directly formed on the surface of the first substrate SUB1 formed of a glass substrate but is not limited thereto. For example, in order to prevent an alkali ion or the like from a glass substrate from being mixed, a silicon nitride film or the like may be formed on the surface of the first substrate SUB1 as a ground layer, and the gate electrode GT may be formed on the ground layer.

Figure 2B:
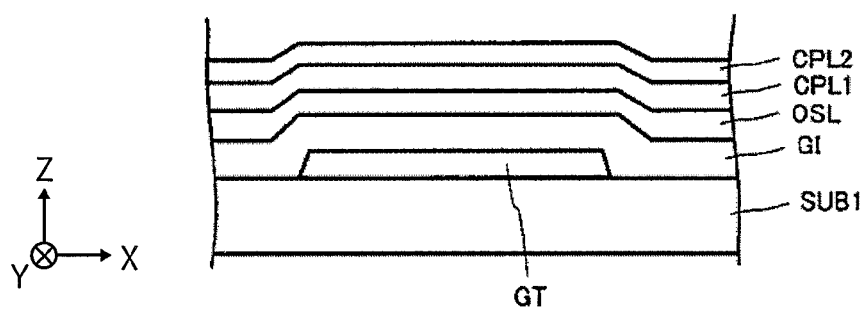
FIG. 2B is a diagram illustrating a manufacturing method of the thin film transistor according to Embodiment 1 of the present invention.

Next, a silicon oxide film, a silicon nitride film, or a silicon oxynitride film is formed over the first substrate SUB1 provided with the gate electrode GT, for example, using a well-known plasma Chemical Vapor Deposition (CVD) method, so as to form the gate insulating film GI.

b) Formation of Oxide Semiconductor (Refer to FIG. 2B)

An oxide semiconductor OSL based on In—Ga—Zn—O, In—Al—Zn—O, In—Sn—Zn—O, In—Zn—O, In—Sn—O, Zn—O, Sn—O, or the like is formed over the first substrate SUB1 provided with the gate insulating film GI using a well-known sputtering method. The oxide semiconductor OSL is a thin film layer for forming the oxide semiconductor layer OSL as described later in detail. Here, a plasma treatment is applied to the oxide semiconductor layer (oxide semiconductor) OSL using oxygen or dinitrogen oxide, and thereby it is possible to form the oxide semiconductor layer OSL with small oxygen deficiency.

c) Formation of Silicon Oxide Film (Refer to FIG. 2B)

A first silicon oxide film CPL1 and a second silicon oxide film CPL2 are continuously formed in this order over the first substrate SUB1 provided with the oxide semiconductor OSL using a well-known plasma CDV method or the like. At this time, the film density of the silicon oxide film used for the first channel protective layer CPL1 is higher than the film density of the silicon oxide film used for the second channel protective layer CPL2. In other words, the silicon oxide films of two layers with different film densities are formed.

The silicon oxide films used for the first channel protective layer CPL1 and the second channel protective layer CPL2 of Embodiment 1 are thin films having silicon and oxygen as main components and use the same elements. These thin film layers can be continuously formed by changing a flow ratio or pressure of a gas in the middle of forming the silicon oxide film which will become the first channel protective layer CPL1 and by successively forming the silicon oxide film which will become the second channel protective layer CPL2. In this case, since the first channel protective layer CPL1 and the second channel protective layer CPL2 can be formed only by changing the film formation condition, it is not necessary to transport the first substrate SUB1, and thus it is possible to considerably shorten the time required to form the silicon oxide films of two layers with different film densities.

In the configuration of the channel protective layers CPL formed of the silicon oxide films of two layers with different film densities, it can be interpreted that the first channel protective layer and the second channel protective layer are aligned and are channel protective layers in which the density greatly varies in the films. In addition, in relation to the film densities of the formed first and second channel protective layers CPL1 and CPL2, it is possible to evaluate the film density in the film thickness direction by using an X-rays reflectance measurement method in which spectral analysis is performed on fluorescent X-rays generated through radiation with X-rays.

In relation to a method of forming a high density silicon oxide film, a film formation condition depending on a film formation device may be optimized when forming the film, such as, for example, an increase in output density of Radio Frequency (RF), an increase in film formation temperature, or an increase in dinitrogen oxide. This high density film prevents impurities from being permeated into the oxide semiconductor layer OSL which is a semiconductor layer, and thus it is possible to implement a thin film transistor TFT with high reliability. Here, the impurities in this case include, for example, nitrogen, oxygen, carbon dioxide, hydrogen, water, hydroxide, hydrocarbon, alcohol, and the like.

In addition, the film density of the silicon oxide film used for the second channel protective layer CPL2 is lower than the film density of the silicon oxide film used for the first channel protective layer CPL1. Particularly, if a high density film is formed thickly, this causes the film stress to be increased and thus the film to be peeled off. Therefore, the silicon oxide film forming the second channel protective layer CPL2 is formed so as to have a relatively lower density than the silicon oxide film forming the first channel protective layer CPL1, so as to alleviate the film stress and prevent the film peeling, thereby forming favorable channel protective layers CPL. In addition, the film thickness of the first channel protective layer CPL1 is preferably approximately 200 nm or less.

Figure 2C:
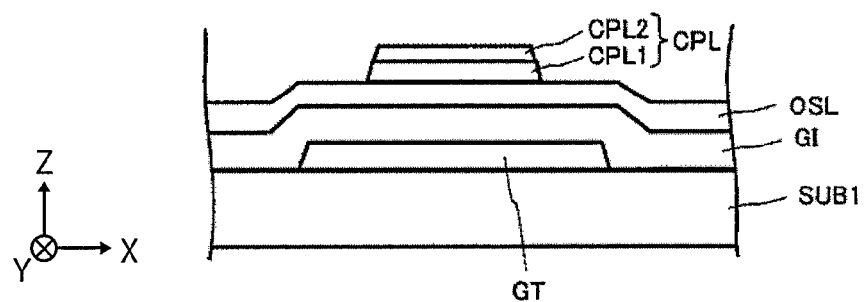
FIG. 2C is a diagram illustrating a manufacturing method of the thin film transistor according to Embodiment 1 of the present invention.

Through the above-described film formation processes of (b) and (c), as shown in FIG. 2(B), the first substrate SUB1 is formed in which the oxide semiconductor OSL, the silicon oxide film which will become the first channel protective layer CPL1, and the silicon oxide film which will become the second channel protective layer CPL2 are sequentially laminated on the upper surface of the gate insulating film GI.

d) Formation of First and Second Channel Protective Layers (Refer to FIG. 2C)

Figure 2D:
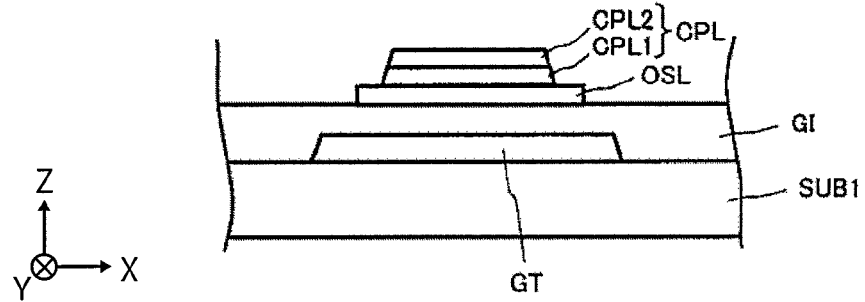
FIG. 2D is a diagram illustrating a manufacturing method of the thin film transistor according to Embodiment 1 of the present invention.

A photosensitive resin film is applied on the second channel protective layer CPL2, is developed, and is patterned, so as to form a resist pattern (not shown) corresponding to a shape of channel protective layers CPL. Then, the second channel protective layer CPL2 exposed from the resist pattern is removed using dry etching, and the first channel protective layer CPL1 which is exposed by etching the second channel protective layer CPL2 is also removed using dry etching. As above, in Embodiment 1, the second channel protective layer CPL2 and the first channel protective layer CPL1 are continuously etched, then, the resist pattern is peeled off, and the channel protective layers CPL formed of the silicon oxide films of two layers including the first channel protective layer CPL1 and the second channel protective layer CPL2 are formed. Through the formation process of the first channel protective layer CPL1 and the second channel protective layer CPL2, as shown in FIG. 2C, the channel protective layers CPL formed of the thin films (silicon oxide films) of two layers including the first channel protective layer CPL1 and the second channel protective layer CPL2 which have an island shape in the X direction are formed on the upper surface of the oxide semiconductor OSL which is formed so as to cover the surface of the first substrate SUB1.

e) Formation of Oxide Semiconductor Layer (Refer to FIG. 2D)

Figure 3E:
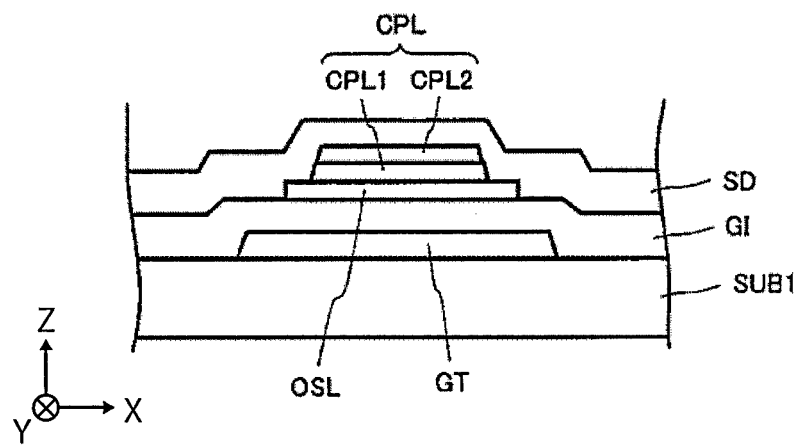
FIG. 3E is a diagram illustrating a manufacturing method of the thin film transistor according to Embodiment 1 of the present invention.
Figure 3F:
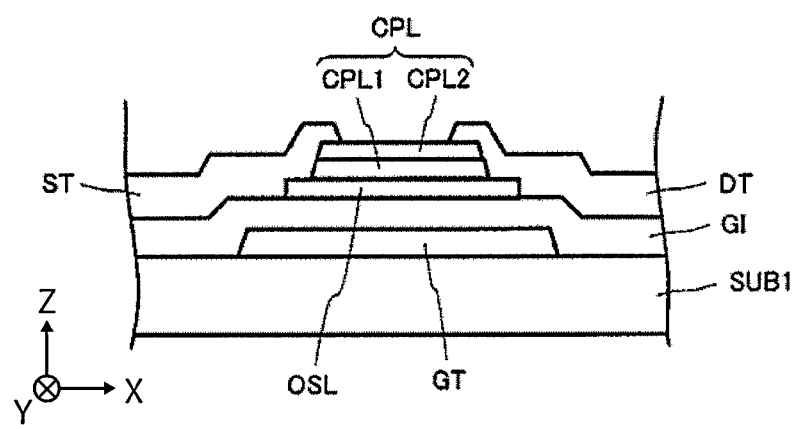
FIG. 3F is a diagram illustrating a manufacturing method of the thin film transistor according to Embodiment 1 of the present invention.

A photosensitive resin film is applied over the first substrate SUB1 including the oxide semiconductor OSL on which the channel protective layers CPL are formed, is developed, and is patterned, so as to form a resist pattern (not shown) corresponding to a shape of the oxide semiconductor layer OSL. Successively, the oxide semiconductor OSL exposed from the resist pattern is removed (patterned) using wet etching, and, then, the resist pattern is peeled off to form the oxide semiconductor layer OSL. Through the formation process of the oxide semiconductor layer OSL, as shown in FIG. 2(D), the oxide semiconductor layer OSL having an island shape is formed on the upper surface (Z direction) of the gate insulating film GI which is formed so as to cover the surface of the first substrate SUB1. In this case, the first channel protective layer CPL1 and the second channel protective layer CPL2 are disposed on the upper surface (Z direction) of the oxide semiconductor layer OSL.

f) Formation of Source Electrode and Drain Electrode (Refer to FIGS. 3E and 3F)

A metal conductive film SD such as a molybdenum film or an aluminum film is formed over the substrate provided with the second channel protective layer CPL2, the first channel protective layer CPL1, and the oxide semiconductor layer OSL, that is, the surface of the first substrate SUB1, for example, using a well-known sputtering method (refer to FIG. 3E).

Figure 3G:
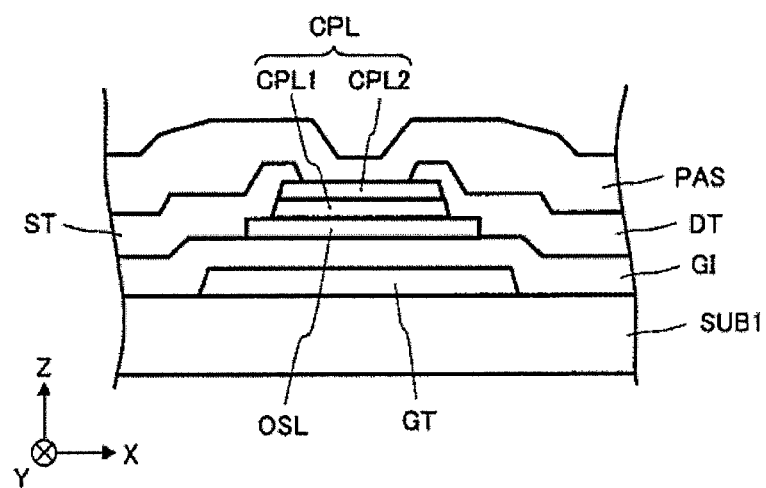
FIG. 3G is a diagram illustrating a manufacturing method of the thin film transistor according to Embodiment 1 of the present invention.

Next, a photosensitive resin film is applied on the metal conductive film SD, is developed, and is patterned, so as to form a resist pattern (not shown) corresponding to a shape of the source electrode ST and the drain electrode DT. Successively, the metal conductive film SD exposed from the resist pattern is removed (etched), for example, using wet etching, and the resist pattern is peeled off. Thereby, the source electrode ST and the drain electrode DT are formed (refer to FIG. 3F).

g) Formation of Passivation Layer (Protective Layer) (Refer to FIG. 3G)

An insulating film such as a silicon oxide film, a silicon nitride film, or a silicon oxynitride film is formed so as to cover the surface of the first substrate SUB1 using a plasma CVD method or the like, thereby forming the passivation layer (protective layer) PAS. Successively, a well-known through-hole (contact hole) (not shown) is formed in the passivation layer PAS, and thereby the source electrode ST and the drain electrode DT can be electrically connected to signal lines (not shown).

In addition, although, in the above-described manufacturing method, the resist masks which are etching masks when forming the first channel protective layer CPL1, the second channel protective layer CPL2, and the oxide semiconductor layer OSL are separately formed, the present invention is not limited thereto. For example, a well-known half exposure technique is used when the second channel protective layer CPL2, the first channel protective layer CPL1, and the oxide semiconductor layer OSL are processed, and thereby it is possible to further reduce a photolithography step. In this case, a photosensitive resin film is applied on an upper surface of a silicon oxide film which will become the second channel protective layer CPL2, then half exposure is performed so as to pattern the photosensitive resin film, and thereby a resist pattern with a thick portion and a thin portion of the photosensitive resin is formed. Next, the second channel protective layer CPL2 and the first channel protective layer CPL1 are dry-etched. Further, through ashing, a processed shape of the oxide semiconductor OSL, that is, the resist pattern of the thin portion of the photosensitive resin is retracted (removed), and the oxide semiconductor layer OSL is formed using wet etching. Thereafter, the resist pattern is peeled off, so as to form the second channel protective layer CPL2, the first channel protective layer CPL1, and the oxide semiconductor layer OSL.

As described above, in the manufacturing method of the thin film transistor according to Embodiment 1, when forming the channel protective layers CPL, a film formation condition of the film formation device (a plasma CVD device) is changed in the middle of film formation through the plasma CVD using the same element, and thereby film formation is continuously performed. Thereby, the first channel protective layer CPL1 with a high film density and the second channel protective layer CPL2 with a lower film density than the first channel protective layer CPL1 are formed from the side which comes into contact with the oxide semiconductor layer OSL. As a result, it is possible to form the channel protective layers CPL of two layers with different film densities using the same film formation device without using different film formation devices, and thus it is possible to form the channel protective layers CPL having a good protective performance without film peeling while reducing the number of processes.

Figure 4:
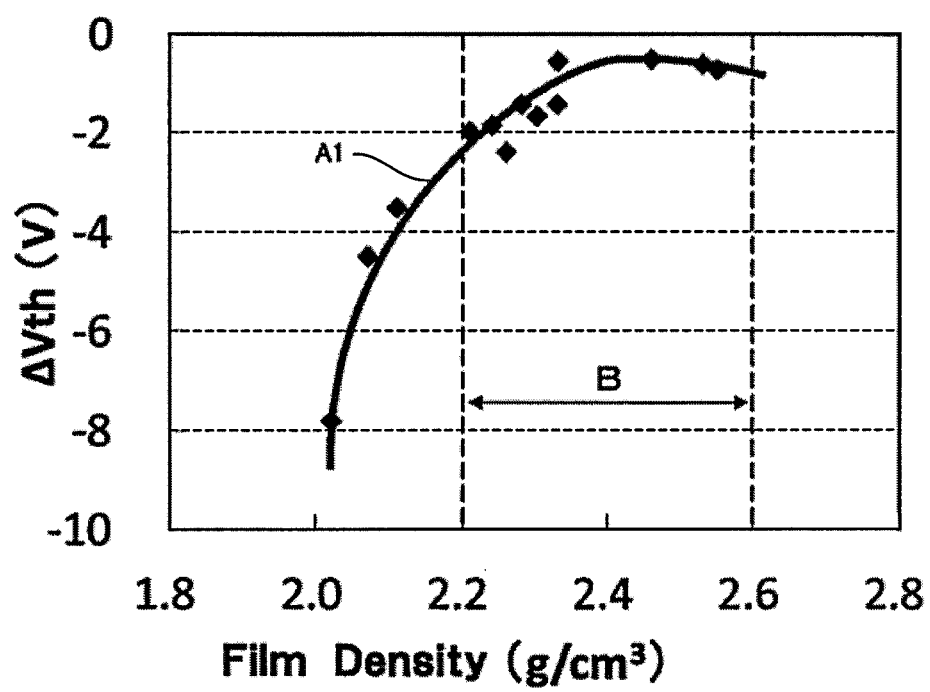
FIG. 4 is a diagram illustrating a measurement result of a threshold voltage variation (ΔVth) relative to a film density of a first channel protective layer in the thin film transistor according to Embodiment 1 of the present invention.

FIG. 4 is a diagram illustrating a measurement result of a threshold voltage variation (ΔVth) relative to the film density of the first channel protective layer in the thin film transistor according to Embodiment 1 of the present invention, and, hereinafter, a description will be made of a relationship between the film density of the first channel protective layer CPL1 of Embodiment 1 and the threshold voltage variation (ΔVth) with reference to FIG. 4. In this case, FIG. 4 is a graph illustrating a threshold voltage variation (ΔVth) when the film density (Film Density) of the first channel protective layer CPL1 is varied in a range of 2.0 g/cm$^3$ to 2.8 g/cm$^3$ by varying a film formation condition. In addition, the threshold voltage variation (ΔVth) is a shift amount of the threshold voltage Vth when a negative bias (−25 V) is applied to the gate for an hour at temperature 85° C. Further, since film peeling occurs in samples in which the film density of the first channel protective layer CPL1 is 2.62 g/cm$^3$ or more and thus the threshold voltage variation (ΔVth) cannot be measured, the threshold voltage variation (ΔVth) corresponding to the film density of 2.62 g/cm$^3$ or more is not shown.

As is clear from the graph A1 of the threshold voltage variation (ΔVth) relative to the film density of the first channel protective layer CPL1 shown in FIG. 4, it can be seen that the threshold voltage variation (ΔVth) is considerably suppressed according to an increase in film density. Particularly, if the film density of the first channel protective layer CPL1 is lower than 2.2 g/cm$^3$, the threshold voltage shift (threshold voltage variation (ΔVth)) rapidly increases. That is, an absolute value of the threshold voltage variation (ΔVth) increases according to a decrease in the film density of the first channel protective layer CPL1. This phenomenon is considered to be because, in a case where the film density of the first channel protective layer CPL1 is low, a passivation performance is reduced, and impurities are permeated into the oxide semiconductor layer OSL. Therefore, the first channel protective layer CPL1 is preferably formed so as to have the film density of 2.2 g/cm$^3$ or more.

On the other hand, film peeling occurred in samples in which the film density of the first channel protective layer CPL1 is 2.62 g/cm$^3$ or more. Therefore, the first channel protective layer CPL1 is preferably formed so as to have the film density of 2.6 g/cm$^3$ or less.

From the above-described result, as indicated by the arrow B in FIG. 4, the film density of the silicon oxide film forming the first channel protective layer CPL1 preferably ranges from 2.2 g/cm$^3$ to 2.6 g/cm$^3$.

FIG. 5 is a table illustrating a result of evaluating whether or not film peeling occurs in samples created by respectively varying the film density of the first channel protective layer and the film density of the second channel protective layer in the thin film transistor according to Embodiment 1. In other words, FIG. 5 is a diagram illustrating a result of evaluating film peeling in the channel protective layers in which the film densities of the first channel protective layer and the second channel protective layer are respectively varied. Hereinafter, with reference to FIG. 5, a description will be made of a relationship between the film density of the first channel protective layer CPL1 and the film density of the second channel protective layer CPL2. In this case, in the sample thin film transistors, shown in FIG. 5, created for evaluating film peeling, the film thickness of the first channel protective layer CPL1 is 200 nm, and the film thickness of the second channel protective layer CPL2 is 300 nm.

As shown in FIG. 5, in the thin film transistor of the sample number 1 (No. 1), the film density of the first channel protective layer CPL1 is 2.21 g/cm$^3$, and the film density of the second channel protective layer CPL2 is 1.89 g/cm$^3$. In this case, a difference between the film density of the first channel protective layer CPL1 and the film density of the second channel protective layer CPL2 is 0.32 g/cm$^3$, and film peeling did not occur.

In the thin film transistors of the sample numbers 2 and 3, both of the first channel protective layers CPL1 are 2.43 g/cm$^3$. On the other hand, the film density of the second channel protective layer CPL2 is 2.21 g/cm$^3$ in the thin film transistor of the sample number 2, and is 2.32 g/cm$^3$ in the thin film transistor of the sample number 3. In this case, a difference between the film density of the first channel protective layer CPL1 and the film density of the second channel protective layer CPL2 is 0.22 g/cm$^3$ and 0.11 g/cm$^3$ in order, and film peeling occurred in both of the two.

In the thin film transistors of the sample numbers 4 and 5, both of the first channel protective layers CPL1 are 2.56 g/cm$^3$. On the other hand, the film density of the second channel protective layer CPL2 is 2.21 g/cm$^3$ in the thin film transistor of the sample number 4, and is 2.30 g/cm$^3$ in the thin film transistor of the sample number 5. In this case, a difference between the film density of the first channel protective layer CPL1 and the film density of the second channel protective layer CPL2 is 0.35 g/cm$^3$ and 0.26 g/cm$^3$ in order. Here, the thin film transistor of the sample number 4 generated a result in which film peeling did not occur, and the thin film transistor of the sample number 5 generated a result in which film peeling occurred.

In addition, in the thin film transistors of the sample numbers 6, 7 and 8, all of the first channel protective layers CPL1 are 2.60 g/cm$^3$. On the other hand, the film density of the second channel protective layer CPL2 is 2.56 g/cm$^3$ in the thin film transistor of the sample number 6, is 2.30 g/cm$^3$ in the thin film transistor of the sample number 7, and is 2.21 g/cm$^3$ in the thin film transistor of the sample number 8. Therefore, a difference between the film density of the first channel protective layer CPL1 and the film density of the second channel protective layer CPL2 is 0.04 g/cm$^3$, 0.30 g/cm$^3$, and 0.39 g/cm$^3$ in order. Here, the thin film transistor of the sample number 6 generated a result in which film peeling occurred, and the thin film transistors of the sample numbers 7 and 8 generated a result in which film peeling did not occur.

It can be seen from the above-described result that film peeling did not occur in the thin film transistors of the sample numbers 1, 4, 7 and 8 in which a difference between the film density of the first channel protective layer CPL1 and the film density of the second channel protective layer CPL2 is 0.3 g/cm$^3$ or more among the thin film transistors of the sample numbers 1 to 8. This is considered to be because the film stress cannot be alleviated as the film stress of the second channel protective layer CPL2 becomes closer to the film stress of the first channel protective layer CPL1. Therefore, the first channel protective layer CPL1 and the second channel protective layer CPL2 are preferably formed such that the film density of the second channel protective layer CPL2 is lower than the film density of the first channel protective layer CPL1, and a film density difference is 0.3 g/cm$^3$ or more.

As described above, the thin film transistor according to Embodiment 1 includes the gate electrode GT provided on the upper surface of the first substrate SUB1 which is an insulating substrate, and the gate insulating film GI provided so as to cover the gate electrode GT. In addition, the thin film transistor includes the oxide semiconductor layer OSL provided on the gate insulating film GI, the channel protective layers CPL provided on the upper surface of the oxide semiconductor layer OSL, and the source electrode ST and the drain electrode DT provided so as to come into contact with the oxide semiconductor layer OSL. Further, in relation to the film densities of the channel protective layers CPL, the film density of the layer which comes into contact with the oxide semiconductor layer OSL is higher than the film density of the layer distant from the oxide semiconductor layer OSL. In other words, the channel protective layers CPL of Embodiment 1 include at least the first channel protective layer CPL1 provided so as to come into contact with the oxide semiconductor layer OSL and the second channel protective layer CPL2 formed on the upper surface of the first channel protective layer CPL1. In this case, the film density of the first channel protective layer CPL1 which comes into contact with the oxide semiconductor layer OSL is higher than the film density of the second channel protective layer CPL2. Therefore, the stress occurring in the first channel protective layer CPL1 with a high film density can be alleviated by the second channel protective layer CPL2 with a low film density, and thus it is possible to prevent film peeling from occurring in the channel protective layers CPL.

In addition, in the configuration of the thin film transistor according to Embodiment 1, the channel protective layers CPL are formed of two or more thin film layers of which film densities are different and a constituent element is the same. Here, time for forming the channel protective layer CPL with a low film density is shorter than time for forming the channel protective layer CPL with a high film density, and thus it is possible to shorten the time for forming the channel protective layers CPL. As a result, it is possible to improve production efficiency of the thin film transistor.

In addition, although a description has been made of a case where the channel protective layers CPL of Embodiment 1 are formed of silicon oxide films of two layers in which the film densities of the first channel protective layer CPL1 and the second channel protective layer CPL2 are different from each other, the present invention is not limited thereto. For example, the channel protective layers CPL may be formed using silicon oxide films of three or more layers with different film densities, and the film densities may sequentially decrease from the silicon oxide film formed closely to the oxide semiconductor layer OSL.

Embodiment 2

Figure 6:
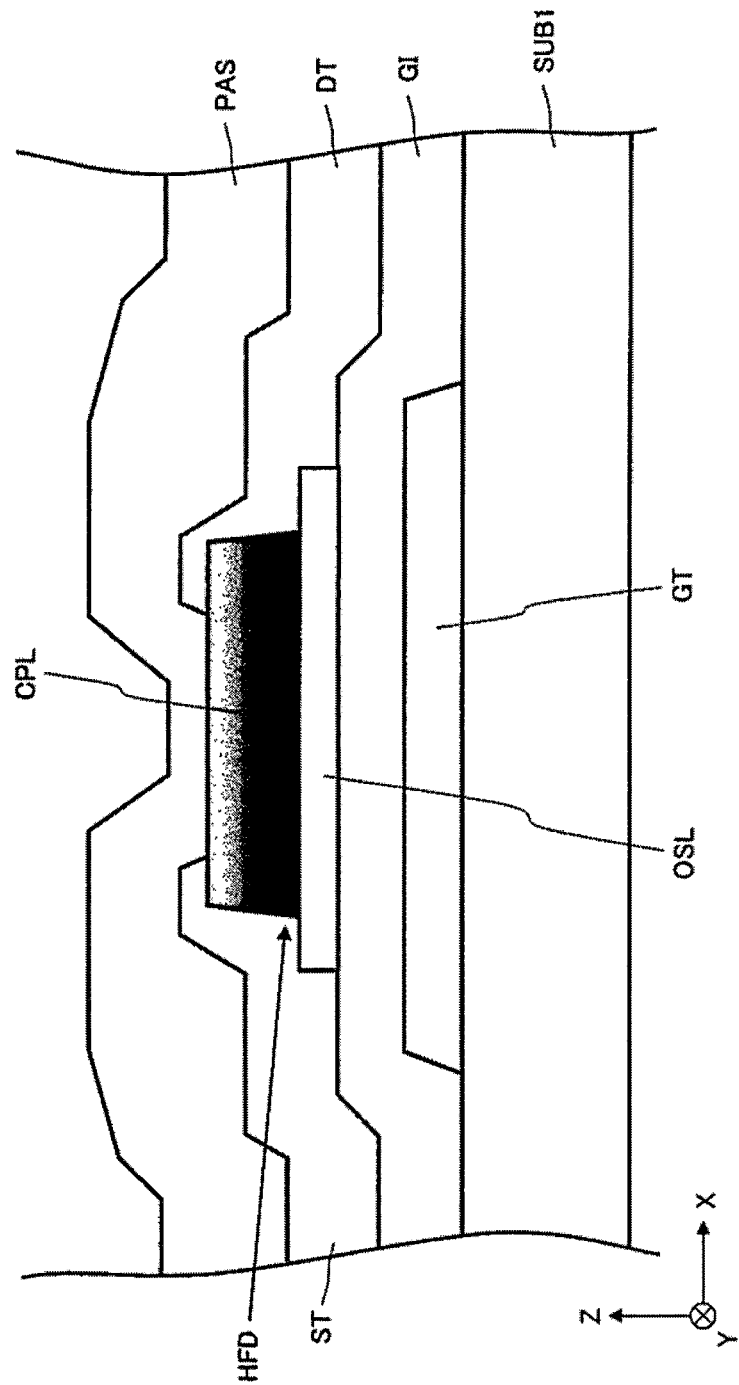
FIG. 6 is a cross-sectional view illustrating a schematic configuration of a thin film transistor according to Embodiment 2 of the present invention.

FIG. 6 is a cross-sectional view illustrating a schematic configuration of a thin film transistor according to Embodiment 2 of the present invention, and, hereinafter, with reference to FIG. 6, the thin film transistor according to Embodiment 2 will be described in detail. However, the thin film transistor according to Embodiment 2 have the same configuration as the thin film transistor according to Embodiment 1 except for a configuration of the channel protective layer CPL. Therefore, in the following description, a configuration of the channel protective layers CPL and a manufacturing method thereof will be described in detail.

As shown in FIG. 6, in the thin film transistor according to Embodiment 2, the channel protective layer CPL is formed of a silicon oxide film of a single layer. In this case, in the channel protective layer CPL according to Embodiment 2, as indicated by gradation in FIG. 6, the film density thereof continuously decreases in the film thickness direction of the channel protective layers CPL. In other words, the film density continuously decreases from one surface side close to the oxide semiconductor layer OSL to the other surface side opposite thereto. Particularly, in the channel protective layer CPL of Embodiment 2, a portion where the channel protective layer CPL comes into contact with the oxide semiconductor layer OSL and the vicinity thereof (a portion HFD indicated by the arrow in FIG. 6) are formed so as to have a high film density.

The film density of the channel protective layer CPL in the portion which comes into contact with the oxide semiconductor layer OSL and the vicinity thereof, indicated by the arrow HFD, is preferably 2.2 g/cm$^3$ or more. For example, in a case where the film density of the channel protective layer CPL in the portion which comes into contact with the oxide semiconductor layer OSL and the vicinity thereof is 2.4 g/cm$^3$, the film density of a portion coming into contact with the passivation layer which is an opposite surface side and the vicinity thereof is preferably 2.1 g/cm$^3$. In addition, the film thickness of the channel protective layer CPL is preferably 600 nm or less. With this configuration, in the same manner as in Embodiment 1, a threshold voltage (Vth) variation is small even in a case where the thin film transistor is operated for a long time, and, since the film stress is alleviated when the channel protective layer is manufactured, it is possible to form a favorable channel protective layer CPL in which film peeling is prevented.

In addition, in the configuration of the channel protective layer CPL of Embodiment 2, the film density thereof continuously varies, and thus a film formation condition continuously and gradually varies when a silicon oxide film is formed as described later in detail. Therefore, when the silicon oxide film which will become the channel protective layer CPL is formed, waiting time is not necessary until the film formation device becomes stable after the film formation condition is changed. As a result, it is possible to further shorten the time required to form a film than in Embodiment 1, and thus it is possible to achieve a special effect in which production efficiency can be further improved.

The channel protective layer CPL of Embodiment 2 may be formed in a manufacturing method described below. However, in the manufacturing method according to Embodiment 2 described below, processes other than a process of forming the channel protective layer CPL are the same as in Embodiment 1.

In a method of forming the channel protective layer CPL of Embodiment 2, a silicon oxide film is formed over a substrate provided with the oxide semiconductor layer OSL, for example, using a plasma CVD method. When the silicon oxide film is formed, particularly, when a portion which comes into contact with the oxide semiconductor layer OSL and the vicinity thereof are formed, a film formation condition depending on a film formation device is optimized, such as, for example, an increase in output density of RF, an increase in film formation temperature, or an increase in dinitrogen oxide, in order to form a high density film, when the film formation starts. Thereafter, a film formation condition depending on the film formation device is optimized such that the film density is reduced and the film stress is alleviated by gradually reducing the output density of RF, decreasing film formation temperature, and/or decreasing a flow rate of dinitrogen oxide.

Next, a photosensitive resin film which will become a resist material is applied, is developed, and is patterned, so as to form a resist pattern corresponding to a shape of channel protective layer CPL. Then, the channel protective layer CPL exposed from the resist pattern is removed using dry etching, and the resist pattern is peeled off so as to form the channel protective layer CPL. In this case, in forming the channel protective layer CPL of Embodiment 2, as described above, the film density continuously varies, and thus there is a feature in which the side wall portion of the channel protective layer CPL tends to be tapered in a forward direction when the etching is performed. Particularly, in the configuration of Embodiment 2, the film density of the portion close to the oxide semiconductor layer OSL is high, and the film density decreases as the distance from the oxide semiconductor layer OSL becomes longer. Therefore, the width of the channel protective layers CPL close to the oxide semiconductor layer OSL is large, and the width decreases as the distance from the oxide semiconductor layer OSL becomes longer. In other words, a tilt angle of the side wall surface of the channel protective layer CPL relative to the laminate surface (in-surface direction of the first substrate SUB1) of the channel protective layer CPL can be formed gently. Therefore, it is possible to achieve a special effect in which the source electrode ST and the drain electrode DT which are formed over from the upper surface to the side wall surface of the channel protective layer CPL and the upper surface and the side wall surface of the oxide semiconductor layer OSL are prevented from being disconnected.

By forming the above-described channel protective layer CPL of Embodiment 2, the region HFD in which the film density of the channel protective layer CPL is high is formed so as to come into contact with the oxide semiconductor layer OSL, and thus it is possible to prevent impurities from permeating into the oxide semiconductor layer OSL, thereby forming a thin film transistor with high reliability.

As described above, in the thin film transistor according to Embodiment 2, the channel protective layer CPL is formed of a single thin film layer (silicon oxide film), and the film density of the thin film layer continuously decreases from a portion which comes into contact with the oxide semiconductor layer OSL which is a lower side to a portion which comes into contact with the passivation layer PAS which is an upper side. As a result, in the same manner as the thin film transistor according to Embodiment 1, since the region of the channel protective layer CPL which comes into contact with the oxide semiconductor layer OSL can be formed with high density, it is possible to form a thin film transistor with high mobility and high On/Off ratio. Further, since the film density of the region which comes into contact with the oxide semiconductor layer OSL is high, it is possible to prevent impurities from permeating into the oxide semiconductor layer OSL and to thereby improve reliability of the thin film transistor. In addition, since the film density continuously decreases toward the portion distant from the oxide semiconductor layer OSL in the thickness direction, it is possible to reduce the film stress occurring in the channel protective layer CPL and to thereby prevent film peeling in the channel protective layer CPL, thereby further improving reliability. Further, since the high density region which requires a long time for film forming is the portion which comes into contact with the oxide semiconductor layer OSL and the vicinity thereof, and thus it is not necessary to form the entire channel protective layer CPL with high density, it is also possible to achieve a special effect in which productivity can be improved.

Embodiment 3

Figure 7:
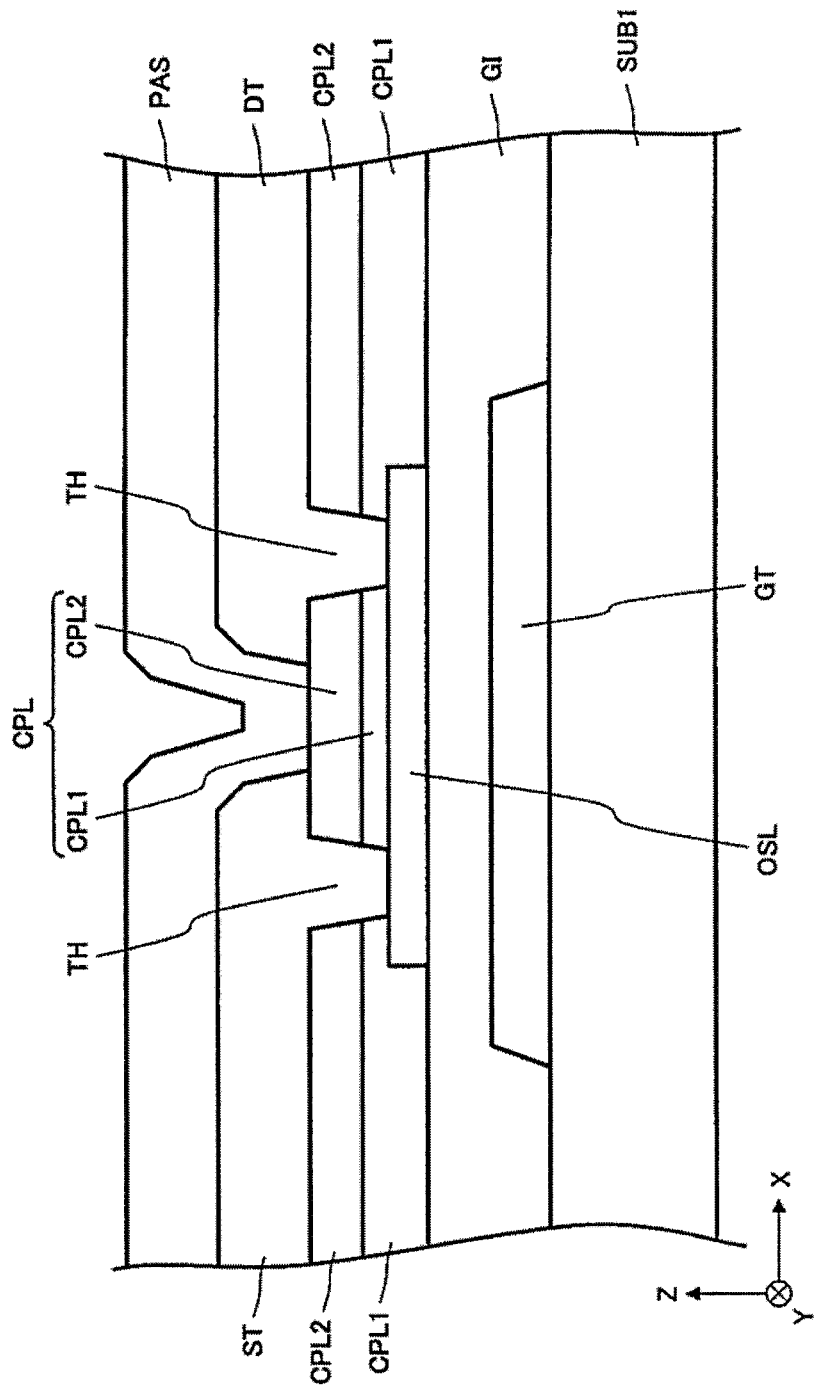
FIG. 7 is a cross-sectional view illustrating a schematic configuration of a thin film transistor according to Embodiment 3 of the present invention.

FIG. 7 is a cross-sectional view illustrating a schematic configuration of a thin film transistor of Embodiment 3, and, hereinafter, the thin film transistor of Embodiment 3 will be described in detail with reference to FIG. 7. However, the thin film transistor according to Embodiment 3 has the same configuration as the thin film transistor according to Embodiment 1 except for configurations of the source electrode ST, the drain electrode DT, and the channel protective layer CPL. Therefore, in the following, configurations of the source electrode ST, the drain electrode DT, and the channel protective layer CPL will be described in detail.

As shown in FIG. 7, in the thin film transistor according to Embodiment 3, the gate electrode GT is formed on the upper surface of the first substrate SUB1, and the gate insulating film GI is formed on the surface of the first substrate SUB1 so as to also cover the gate electrode GT. In addition, the oxide semiconductor layer OSL is formed on the upper surface of the gate insulating film GI in an island shape at a position overlapping the gate electrode GT, and the channel protective layers CPL are formed on the upper surface of the gate insulating film GI so as to also cover the oxide semiconductor layer OSL. In this case, in the thin film transistor according to Embodiment 3, in the same manner as in Embodiment 1, the channel protective layers CPL are formed of thin film layers (for example, silicon oxide films) of two layers including the first channel protective layer CPL1 and the second channel protective layer CPL2. Further, also in the first channel protective layer CPL1 and the second channel protective layer CPL2, in the same manner as in Embodiment 1, the first channel protective layer CPL1 is formed with a high film density, and the second channel protective layer CPL2 is formed with a lower film density than the first channel protective layer CPL1.

In addition, in the thin film transistor of Embodiment 3, the silicon oxide films (indicated by CPL1 and CPL2 in FIG. 7) of two layers with different film densities which will become the first channel protective layer CPL1 and the second channel protective layer CPL2 cover at least a region where the thin film transistor is formed. In addition, a conductive film which will become the source electrode ST and the drain electrode DT is formed on the upper surface of the silicon oxide films, and the source electrode ST and the drain electrode DT are electrically connected to the oxide semiconductor layer OSL via through-holes TH provided in the silicon oxide films. Therefore, of the silicon oxide films, the silicon oxide film of a region which overlaps the oxide semiconductor layer OSL and is interposed between the source electrode ST and the drain electrode DT functions as the channel protective layer CPL of the thin film transistor, and the other region functions as a protective layer. As such, the channel protective layers CPL cover other regions along with the channel formation region, and a performance of protecting other regions can also be improved.

In this case, in relation to the film density or the film thickness, the film density or the film thickness in the region interposed between the source electrode ST and the drain electrode DT is the same as in Embodiment 1. In other words, in a case where the channel protective layers CPL are formed of silicon oxide films, the silicon oxide film forming the first channel protective layer CPL1 is formed of a thin film with high film density, and the film density thereof is preferably 2.2 g/cm$^3$ or more and 2.6 g/cm$^3$ or less. This is because it is possible to implement a thin film transistor TFT with high reliability. In addition, the film density of the silicon oxide film forming the second channel protective layer CPL2 is lower than the film density of the silicon oxide film forming the first channel protective layer CPL1, and, for example, if the film density of the first channel protective layer CPL1 is 2.6 g/cm$^3$, it is preferable that the film density of the second channel protective layer CPL2 is 2.3 g/cm$^3$. This is because, in the same manner as in Embodiment 1, a threshold voltage (Vth) variation is small even in a case where the thin film transistor is operated for a long time, and the film stress is alleviated when the channel protective layer is manufactured, it is possible to form a favorable channel protective layer CPL in which film peeling is prevented.

The source electrode ST and the drain electrode DT are formed on the upper surface of the channel protective layers CPL. Particularly, in the thin film transistor according to Embodiment 3, the through-holes TH which penetrate from the channel protective layers CPL to the oxide semiconductor layer OSL are formed, and the source electrode ST and the drain electrode DT are electrically connected to the oxide semiconductor layer OSL at opposite positions to each other via the through-holes TH. The passivation layer PAS is formed on the upper surface of the second channel protective layer CPL2 so as to also cover the source electrode ST and the drain electrode DT.

Next, a manufacturing method of the thin film transistor according to Embodiment 3 will be described. However, a manufacturing method of thin film layers other than the source electrode ST, the drain electrode DT, and the channel protective layers CPL is the same as in Embodiment 1. Therefore, in the following, a description will be made of manufacturing processes of the source electrode ST, the drain electrode DT, and the channel protective layers CPL.

First, in the same manner as in Embodiment 1, the gate electrode GT and the gate insulating film GI are sequentially formed on the surface of the first substrate SUB1.

Next, in order to form the oxide semiconductor layer OSL using an oxide semiconductor based on In—Ga—Zn—O including indium, gallium, zinc, and oxygen as main component elements, a thin film layer (a thin film layer of oxide semiconductor) for forming the oxide semiconductor layer OSL is formed over the surface of the first substrate SUB1 provided with the gate insulating film GI, using a sputtering method. Thereafter, a resist pattern corresponding to a shape of the oxide semiconductor layer OSL is formed on the surface of the thin film layer of the oxide semiconductor, and the thin film layer of the oxide semiconductor exposed from the resist pattern is removed (etched) using wet etching. Then, the resist pattern is peeled off so as to form the oxide semiconductor layer OSL with an island shape. In addition, in the same manner as Embodiment 1, the oxide semiconductor layer OSL is not limited to the In—Ga—Zn—O oxide semiconductor and may be other oxide semiconductors as described in Embodiment 1.

Next, silicon oxide films (first and second silicon oxide films) which will become the first channel protective layer CPL1 and the second channel protective layer CPL2 are formed in this order on the upper surface of the gate insulating film GI so as to also cover the oxide semiconductor layer OSL with an island shape, for example, using a plasma CVD method or the like. In this case, the film density of the silicon oxide film (first silicon oxide film) used for the first channel protective layer CPL1 is high, and, the film density thereof is preferably 2.2 g/cm$^3$ or more and 2.6 g/cm$^3$ or less in the same manner as in Embodiment 1. With this configuration, in the same manner as in Embodiment 1, it is possible to prevent impurities from permeating into the oxide semiconductor layer OSL from the first channel protective layer CPL1 which comes into contact with the upper surface of the oxide semiconductor layer OSL, and thus it is possible to improve reliability of the thin film transistor TFT. In other words, a phenomenon happens in which water, hydrogen or hydrocarbon is adsorbed to the oxide semiconductor OSL using IGZO to generate a defect level, and thus a threshold voltage Vth is shifted by gate bias stress. However, in the configuration of Embodiment 3, in the same manner as in Embodiment 1, since the film density of the first channel protective layer CPL1 is high, it is possible to prevent impurities such as water, hydrogen or hydrocarbon from being adsorbed to the oxide semiconductor OSL using the IGZO. As a result, it is possible to prevent a variation in threshold voltage Vth and to thereby improve reliability of the thin film transistor.

As above, the film density of the silicon oxide film (first silicon oxide film) used for the first channel protective layer CPL1 is higher than the film density of the silicon oxide film (second silicon oxide film) used for the second channel protective layer CPL2 in the same manner as in Embodiment 1. In order to form the high density silicon oxide film, in the same manner as in Embodiment 1, a film formation condition depending on a film formation device may be appropriately selected, such as, for example, an increase in output density of RF, an increase in film formation temperature, or an increase in dinitrogen oxide, when the film is formed. In this case, the film density of the silicon oxide film (second silicon oxide film) used for the second channel protective layer CPL2 is made lower than the film density of the first silicon oxide film for forming the first channel protective layer CPL1. If a high density film is formed thickly, this causes the film stress to be increased and thus the film to be peeled off. In contrast, also in Embodiment 3, in the same manner as in Embodiment 1, the second silicon oxide film for forming the second channel protective layer CPL2 is formed of a film with a relatively low film density, and thus it is possible to achieve the same effect as in Embodiment 1. For example, since the film stress of the channel protective layers CPL is alleviated so as to prevent the film peeling, it is possible to form favorable channel protective layers CPL.

Next, a resist material formed of a photosensitive resin film is applied on the upper surface (surface) of the second channel protective layer CPL2, is developed, and is patterned, so as to form a resist pattern. In this case the resist pattern is formed such that the source electrode ST and the drain electrode DT come into contact with the oxide semiconductor layer OSL as shown in FIG. 7. In other words, of the channel protective layers CPL overlapping the oxide semiconductor layer OSL, the resist pattern is formed so as to form the through-holes TH which expose the surface of the oxide semiconductor layer OSL in the channel protective layer CPL corresponding to the opposite edge of the oxide semiconductor layer OSL. Thereafter, the second channel protective layer exposed from the resist pattern is removed using dry etching. In this case, the second channel protective layer and the first channel protective layer are continuously etched before peeling off the resist pattern.

Next, a metal thin film is formed over the substrate provided with the second channel protective layer CPL2, the first channel protective layer CPL1, and the oxide semiconductor layer, that is, the surface of the first substrate SUB1, using a sputtering method. In this case, the metal thin film is formed so as to come into contact with the oxide semiconductor layer OSL via the through-holes TH formed in the channel protective layers CPL. Here, the metal thin film is made of elements selected from aluminum, molybdenum, chromium, copper, tungsten, titanium, zirconium, tantalum, silver, and manganese, or an alloy or the like which is a combination of these elements, in the same manner as in Embodiment 1. In addition, a laminate structure may be employed in which aluminum is laminated on titanium, or titanium is interposed between an upper layer and a lower layer of aluminum.

Successively, a resist material using a photosensitive resin film is applied on the metal conductive film, is developed, and is patterned, so as to form a resist pattern corresponding to a shape of the source electrode ST and the drain electrode DT. Thereafter, the metal conductive film exposed from the resist pattern is removed using wet etching, and then the resist pattern is peeled off, thereby forming the source electrode ST and the drain electrode DT. Next, the passivation layer PAS which is a protective layer is formed, so as to form the thin film transistor according to Embodiment 3 shown in FIG. 7.

As described above, also in the thin film transistor according to Embodiment 3, in the same manner as in Embodiment 1, the channel protective layers CPL are formed of silicon oxide films of two layers including the first channel protective layer CPL1 and the second channel protective layer CPL2, the first channel protective layer CPL1 is formed of a silicon oxide film with a high film density, and the second channel protective layer CPL2 is formed of a silicon oxide film with the lower film density than the film density of the silicon oxide film of the first channel protective layer CPL1. Therefore, it is possible to achieve the same effect as in Embodiment 1.

In addition, in the configuration of Embodiment 3, the silicon oxide films which function as the channel protective layers CPL are formed so as to cover at least the region where the thin film transistor is formed. In other words, the oxide semiconductor layer OSL is covered by the silicon oxide films forming the channel protective layers CPL in the region other than the through-hole TH formation region, and thus it is possible to further improve an effect of preventing impurities from being permeated into the oxide semiconductor layer OSL. As a result, it is possible to achieve a special effect in which reliability of the thin film transistor can be further improved. In addition, since the channel protective layers CPL cover the surface of the first substrate SUB1, it is possible to achieve a special effect in which the surface of the first substrate SUB1 can be further planarized than in the configurations of Embodiments 1 and 2.

Embodiment 4

Figure 8:
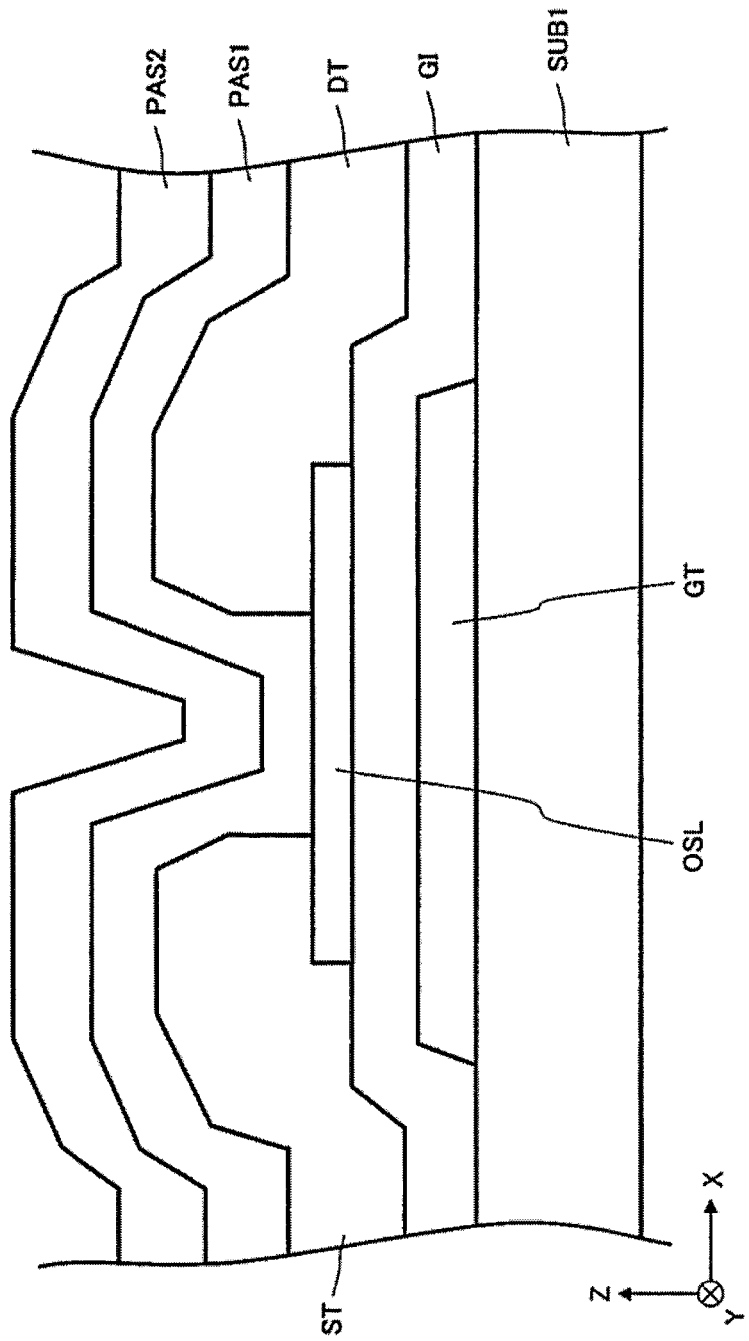
FIG. 8 is a cross-sectional view illustrating a schematic configuration of a thin film transistor according to Embodiment 4 of the present invention.

FIG. 8 is a cross-sectional view illustrating a schematic configuration of a thin film transistor according to Embodiment 4 of the present invention. However, configurations other than a first passivation layer PAS1 and a second passivation layer PAS2 forming the passivation layers (protective layers) PAS are the same as in Embodiment 1 except that there is no channel protective layer. Therefore, in the following, the first passivation layer PAS1 and the second passivation layer PAS2 will be described in detail.

As shown in FIG. 8, in the thin film transistor according to Embodiment 4, the gate electrode GT is formed on the upper surface of the first substrate SUB1, and the gate insulating film GI is formed on the surface of the first substrate SUB1 so as to cover the gate electrode GT. In addition, the oxide semiconductor layer OSL is formed on the upper surface of the gate insulating film GI in an island shape at a position overlapping the gate electrode GT.

The source electrode ST and the drain electrode DT are formed in the opposite edges of the oxide semiconductor layer OSL, and, particularly, in the thin film transistor according to Embodiment 4, the surface region of the oxide semiconductor layer OSL which is not covered by the source electrode ST and the drain electrode DT are covered by the first passivation layer PAS1. In other words, in the thin film transistor according to Embodiment 4, the upper surface of the first substrate SUB1 is covered by the first passivation layer PAS1 which is formed so as to cover the upper surface of the first substrate SUB1 including the source electrode ST, the drain electrode DT, and the exposed surface of the oxide semiconductor layer OSL. In addition, the second passivation layer PAS2 is formed so as to cover the upper surface of the first substrate SUB1 including the upper surface of the first passivation layer PAS1.

In the thin film transistor according to Embodiment 4 with this configuration, the surface of the oxide semiconductor layer OSL comes into contact with passivation layer PAS. On the other hand, the first passivation layer PAS1 and the second passivation layer PAS2 are formed of silicon oxide films, and, particularly, the film density of the silicon oxide film used for the first passivation layer PAS1 is high, and, the film density thereof is preferably 2.2 g/cm$^3$ or more and 2.6 g/cm$^3$ or less. In this configuration, since the surface of the oxide semiconductor layer OSL comes into contact with the silicon oxide film with a high film density forming the first passivation layer PAS1, it is possible to achieve the same effect as in the first channel protective layer CPL1 of Embodiment 1, and thus it is possible to realize a thin film transistor TFT with high reliability.

In addition, the film density of the silicon oxide film used for the second passivation layer PAS2 is lower than the film density of the silicon oxide film used for the first passivation layer PAS1. For example, if the film density of the silicon oxide film used for the first passivation layer PAS1 is 2.5 g/cm$^3$, it is preferable that the film density of the silicon oxide film used for the second passivation layer PAS2 is about 2.2 g/cm$^3$. Even in a case where the relatively thick passivation layers PAS are formed using the silicon oxide films which are inorganic materials, since the film density of the second passivation layer PAS2 is low, it is possible to form the passivation layers PAS in which the film stress is alleviated, film peeling is prevented, and the channel is also favorably protected.

In a manufacturing method of the thin film transistor according to Embodiment 4, in the same manner as in Embodiment 1, first, the gate electrode GT, the gate insulating film GI, and the oxide semiconductor layer OSL are sequentially formed on the upper surface of the first substrate SUB1. Next, a metal conductive film is formed over the first substrate SUB1 provided with the oxide semiconductor layer OSL and the gate insulating film GI so as to come into contact with the oxide semiconductor layer OSL using a sputtering method. Successively, a photosensitive resin film which is a resist material is applied on the metal conductive film, is developed, and is patterned, so as to form a resist pattern corresponding to the source electrode ST and the drain electrode DT. Thereafter, the metal conductive film exposed from the resist pattern is removed using dry etching, and then the resist pattern is peeled off to form the source electrode ST and the drain electrode DT.

Next, the first passivation layer PAS1 and the second passivation layer PAS2 are sequentially formed over the first substrate SUB1 provided with the oxide semiconductor layer OSL, the source electrode ST, and the drain electrode DT, so as to cover the upper surface of the first substrate SUB1, using a plasma CVD method or the like. In this case, the film density of the silicon oxide film used for the first passivation layer PAS1 is higher than the film density of the silicon oxide film used for the second passivation layer PAS2. In addition, a method of forming the high density silicon oxide film may employ the same method as the method of forming the silicon oxide film which is the channel protective layer CPL of Embodiment 1. By forming the high density film, in the same manner as in Embodiment 1, it is possible to prevent impurities from being permeated into the oxide semiconductor layer OSL and to thereby implement a thin film transistor with high reliability. Particularly, since the second passivation layer PAS2 of Embodiment 4 is formed of a silicon oxide film with a lower film density than the first passivation layer PAS1, the film stress of the passivation layer PAS is alleviated and thus it is possible to prevent film peeling.

In addition, in the thin film transistor according to Embodiment 4, the passivation layer PAS which is formed so as to come into contact with the exposed surface of the oxide semiconductor layer OSL is formed of a silicon oxide film, and the first passivation layer PAS1 is formed of a silicon oxide film with a high film density. In other words, the second passivation layer PAS2 is formed of the silicon oxide film with the lower film density than the film density of the silicon oxide film forming the first passivation layer PAS1. Therefore, it is possible to protect the oxide semiconductor layer OSL without forming a channel protective layer for protecting the oxide semiconductor layer OSL separately from the passivation layer PAS. As a result, a process of forming a channel protective layer is not necessary, and thus it is possible to achieve a special effect in which a manufacturing process can be reduced, that is, manufacturing efficiency can be further improved.

Embodiment 5

Figure 9:
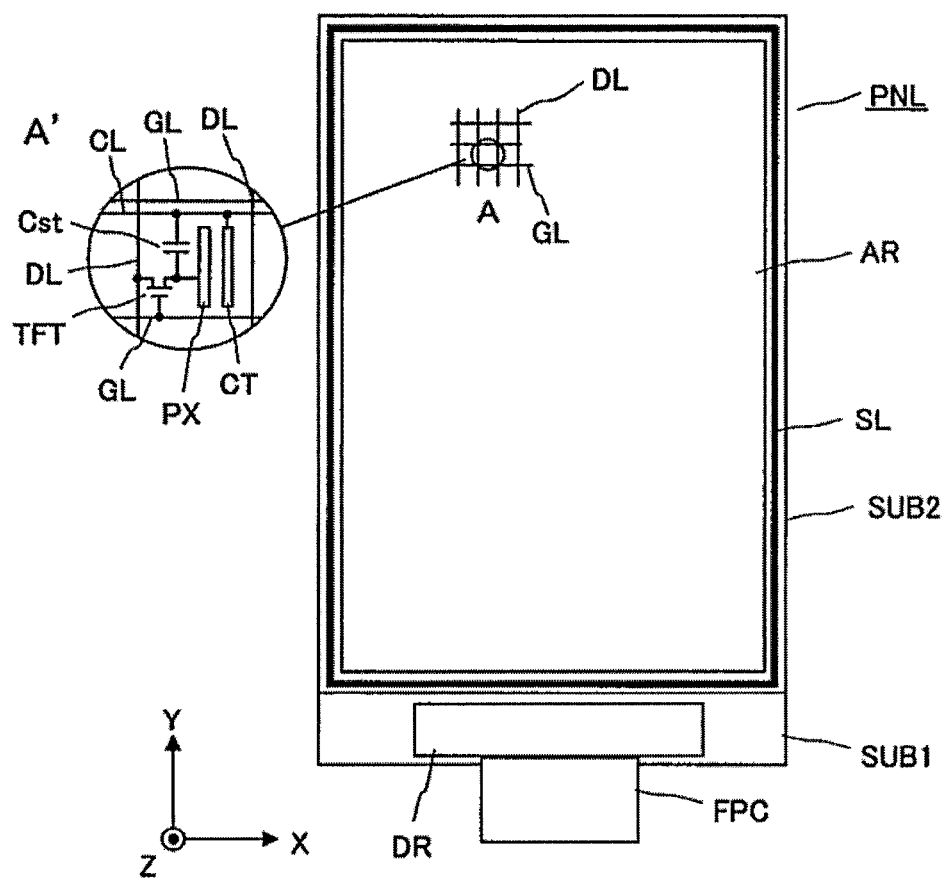
FIG. 9 is a plan view illustrating an overall configuration of a liquid crystal display device according to Embodiment 5 of the present invention.

FIG. 9 is a plan view illustrating an overall configuration of a liquid crystal display device which is a display device according to Embodiment 5 of the present invention, and shows a configuration using the thin film transistor of Embodiments 1 to 4. In addition, although, in Embodiment 5, a case where the present invention is applied to a thin film transistor TFT for switching provided in each pixel is described, the present invention is applicable to a thin film transistor forming a driving circuit DR. Further, although, in Embodiment 5, a case where the thin film transistor of Embodiments 1 to 4 is used for the liquid crystal display device which is a non-emissive display device, the present invention is not limited thereto. For example, the thin film transistor of Embodiments 1 to 4 is applicable to a self-emissive display device such as an organic EL display device.

As shown in FIG. 9, the liquid crystal display device according to Embodiment 5 has a liquid crystal display panel PNL which includes the first substrate SUB1 on which a pixel electrode PX, a thin film transistor TFT, and the like are formed, a second substrate SUB2 which is disposed opposite to the first substrate SUB1 and is provided with a color filter (not shown) and the like, and a liquid crystal layer (not shown) interposed between the first substrate SUB1 and the second substrate SUB2. In addition, the liquid crystal display device is formed by combining the liquid crystal display panel PNL and a backlight unit (backlight device) (not shown) which is a light source. In relation to fixing of the first substrate SUB1 and the second substrate SUB2 and sealing of liquid crystal, the substrates are fixed by a sealing material SL coated in an annular shape in the periphery of the second substrate, and the liquid crystal is also sealed. Here, in the liquid crystal display device of Embodiment 5, a region where a display pixel (hereinafter, abbreviated to a pixel) is formed is a display region AR in the region in which the liquid crystal is sealed. Therefore, even in the region in which the liquid crystal is sealed, a region in which the pixel is not formed and is not related to display is not the display region AR.

In addition, the area of the second substrate SUB2 is smaller than the area of the first substrate SUB1, and thus the lower side part of the first substrate SUB1 is exposed in the figure. A driving circuit DR constituted by a semiconductor chip is mounted on the side part of the first substrate SUB1. The driving circuit DR drives each pixel disposed in the display region AR. In addition, in the following description, even in description of the liquid crystal display panel PNL, a liquid crystal display device is indicated in some cases. In addition, for the first substrate SUB1 and the second substrate SUB2, for example, a well-known glass substrate is generally used as a base material; however, a transparent insulating substrate made of resin may be used.

In the liquid crystal display device according to Embodiment 5, scanning signal lines (gate lines) GL which extend in the X direction, are disposed in parallel in the Y direction, and supplied with scanning signals from the driving circuit DR are formed on the liquid crystal side surface of the first substrate SUB1 and inside the display region AR. In addition, video signal lines (drain lines) DL which extend in the Y direction, are disposed in parallel in the X direction, and are supplied with video signals (grayscale signals) from the driving circuit DR are formed. A region surrounded by two adjacent drain lines DL and two adjacent gate lines GL forms a pixel, and a plurality of pixels are disposed in a matrix in the display region AR along the drain lines DL and the gate lines GL.

For example, as shown in an equivalent circuit diagram A' of the circle A of FIG. 9, each pixel includes a switching thin film transistor TFT which is driven so as to be turned on and off by a scanning signal from the gate line GL, a pixel electrode PX to which a video signal is supplied from the drain line DL via the turned-on thin film transistor TFT, and a common electrode CT to which a common signal with a reference potential with respect to a potential of the video signal is supplied via common line CL. In addition, in the configuration of Embodiment 5, there is provided a storage capacitor Cst of which one terminal is electrically connected to the pixel electrode PX and the other terminal is connected to the common line CL. In addition, the thin film transistor TFT is driven such that a drain electrode and a source electrode are switched depending on application of a bias; however, in the present specification, for convenience, a portion connected to the drain line DL is indicated by the drain electrode, and a portion connected to the pixel electrode PX is indicated by the source electrode.

An electric field which has components parallel to the main surface of the first substrate SUB1 is generated between the pixel electrode PX and the common electrode CT, and the liquid crystal molecules are driven by the electric field. This liquid crystal display device is known for being capable of performing so-called wide viewing angle display, and is called a transverse electric field type from the singularity of application of the electric field to the liquid crystal. In addition, the liquid crystal display device according to Embodiment 5 performs display in a normally black display form in which the light transmittance is the minimum (black display) when the electric field is not applied to the liquid crystal, and the light transmittance increases by applying the electric field.

Each drain line DL and each gate line GL which extend crossing over the sealing material SL at end parts thereof are connected to the driving circuit DR which generates driving signals such as video signals or scanning signals based on input signals which are input from an external system via a flexible print board FPC. In this case, although, in the liquid crystal display device according to Embodiment 5, the driving circuit DR is constituted by a semiconductor chip and is mounted on the first substrate SUB1, either one or both of a video signal driving circuit outputting a video signal and a scanning signal driving circuit outputting a scanning signal may be mounted on the flexible printed board FPC in a tape carrier type or Chip On Film (COF) type, and may be connected to the first substrate SUB1.

In the liquid crystal display device according to Embodiment 5 with this configuration, the thin film transistor TFT uses the thin film transistor of Embodiments 1 to 4, that is, the oxide semiconductor thin film transistor, and thus it is possible to improve reliability of the liquid crystal display device. In addition, since a liquid crystal display device is formed using an oxide semiconductor thin film transistor TFT in a process which is almost equivalent to a liquid crystal display device using an amorphous silicon thin film transistor (a-Si TFT) in which a semiconductor layer is made of amorphous silicon, it is possible to considerably reduce manufacturing costs of the liquid crystal display device using the oxide semiconductor thin film transistor.

Particularly, since an oxide semiconductor thin film transistor TFT of which reliability is improved and mobility is high can be implemented, it is possible to reduce the area taken up by the thin film transistor, and thus it is possible to reduce a formation region of the thin film transistor TFT taking up the pixel region, that is, the area of the region which does not contribute to display. As a result, it is possible to implement a liquid crystal display device with high transmittance and high reliability.

In addition, since the oxide semiconductor thin film transistor in which shift of a threshold voltage Vth is small is used, a circuit for compensating a variation in the threshold voltage Vth is not necessary. As a result, the peripheral portion of the display region AR can also be used as a display region, and thus it is possible to increase the display region AR or decrease a so-called bezel region, which is a peripheral region of the display region AR.

In addition, since, in the oxide semiconductor thin film transistor, the mobility of the thin film transistor TFT can be improved, it is possible to improve display quality in a case where the thin film transistor is applied to a liquid crystal display device with a large number of pixels which is required to be turned on and off at high speed.

Further, since a thin film layer in which the film density of the channel protective layer portion forming the oxide semiconductor thin film transistor TFT is high can be formed thinly, that is, the high density thin film layer of which a film formation rate is low can be formed thinly, it is possible to improve a film formation rate of the channel protective layer CPL portion. As a result, it is possible to shorten the time required to manufacture the first substrate SUB1, and thus it is possible to achieve a special effect in which production efficiency of a liquid crystal display device can be improved.

Particularly, in a case where the thin film transistor of Embodiment 4 is applied to the liquid crystal display device of Embodiment 5, the passivation layer PAS also functions as the storage capacitor Cst, and thus a third passivation layer may be formed on the second passivation layer PAS2 in order to adjust the capacitance of the storage capacitor Cst. In this configuration, since a desired storage capacitor Cst can be formed depending on the third passivation layer, a region where the storage capacitor Cst is formed can be made to be small, and thus it is possible to achieve a special effect in which the transmittance of the liquid crystal display device can be improved. In addition, in the configuration in which the third passivation layer is formed, a silicon nitride film or a silicon oxynitride film with the higher dielectric constant than the silicon oxide film may be used.

It is possible to considerably improve a display performance of an electronic apparatus or the like having a display, such as a mobile phone, a TV, a digital camera, a car navigation system, a PC, or a monitor, using the above-described liquid crystal display device.

In addition, although, in the thin film transistor of Embodiments 1 to 4, the channel protective layers CPL or the passivation layers PAS are formed of silicon oxide films of two layers with different film densities, the present invention is not limited thereto. For example, the channel protective layers CPL or the passivation layers PAS may be formed of silicon oxide films of three or more layers with different film densities.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A thin film transistor comprising:
an insulating substrate;
a gate electrode provided on an upper surface of the insulating substrate;
a gate insulating film formed so as to cover the gate electrode;
an oxide semiconductor layer provided on the gate insulating film;
a channel protective layer provided at least on an upper surface of the oxide semiconductor layer; and
a source electrode and a drain electrode provided so as to come into contact with the oxide semiconductor layer,
wherein the channel protective layer is formed such that the film density of a portion provided so as to come into contact with the oxide semiconductor layer is higher than the film density of a portion distant from the oxide semiconductor layer,
wherein the channel protective layer is formed of a single thin film layer, and
wherein in the channel protective layer, the film density of a region provided so as to come into contact with the oxide semiconductor layer is higher than the film density of other regions, and the film density of the channel protective layer continuously and gradually decreases in a film thickness direction of the region provided so as to come into contact with the oxide semiconductor layer.

2. The thin film transistor according to claim 1, wherein the film thickness of the channel protective layer is 600 nm or less.

3. A display device comprising:
a first substrate formed of an insulating substrate,
wherein the first substrate includes
video signal lines extending in a Y direction and disposed in parallel in an X direction;
scanning signal lines extending in the X direction and disposed in parallel in the Y direction;
pixel electrodes supplied with video signals from the video signal lines via thin film transistors; and
a common electrode supplied with a common signal which are used as a reference of the video signals,
wherein pixel regions surrounded by the video signal lines and the scanning signal lines are formed in a matrix, and
wherein each of the thin film transistors is formed of the thin film transistor according to claim 1.

4. The display device according to claim 3, further comprising:
a liquid crystal display panel including a second substrate disposed opposite to the first substrate with a liquid crystal layer interposed therebetween; and
a backlight unit disposed on a rear side of the liquid crystal display panel and applying backlight which is a light source of the liquid crystal display panel.

5. A method of manufacturing a display device, comprising:
forming a gate electrode on an upper surface of an insulating substrate;
forming a gate insulating film so as to cover the gate electrode;
forming an oxide semiconductor layer on the gate insulating film;
forming a channel protective layer at least on an upper surface of the oxide semiconductor layer by a method being selected from the group consisting of an increase in output density of Radio Frequency (RF), and an increase in dinitrogen oxide, such that the film density of a portion provided so as to come into contact with the oxide semiconductor layer is higher than the film density of a portion distant from the oxide semiconductor layer; and
forming a source electrode and a drain electrode so as to come into contact with the oxide semiconductor layer.

6. The thin film transistor according to claim 1, wherein the channel protective layer is formed so as to also cover the upper surface of the insulating substrate along with the source electrode, the drain electrode, and the oxide semiconductor layer, and
wherein the channel protective layer covers the upper surface of the insulating substrate, and is also used as a passivation layer for protecting the thin film transistor.

7. The thin film transistor according to claim 1, wherein the channel protective layer is formed so as to cover the upper surface of the insulating substrate along with the oxide semiconductor layer,
wherein the source electrode and the drain electrode are formed on an upper surface of the channel protective layer, and are electrically connected to the oxide semiconductor layer via a through-hole formed in the channel protective layer, and
wherein a passivation layer which is a protection film is formed so as to cover the source electrode, the drain electrode, and the channel protective layer.

* * * * *